US011960776B2

(12) United States Patent
Sforzin et al.

(10) Patent No.: US 11,960,776 B2
(45) Date of Patent: Apr. 16, 2024

(54) DATA PROTECTION FOR STACKS OF MEMORY DICE

(71) Applicant: Micron Technology, Inc., Boise, ID (US)

(72) Inventors: Marco Sforzin, Cernusco sul Naviglio (IT); Paolo Amato, Treviglio (IT)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 17/831,263

(22) Filed: Jun. 2, 2022

(65) Prior Publication Data

US 2023/0393789 A1    Dec. 7, 2023

(51) Int. Cl.
| | | |
|---|---|---|
| G06F 11/10 | (2006.01) | |
| G06F 3/06 | (2006.01) | |
| G06F 11/07 | (2006.01) | |
| G06F 11/30 | (2006.01) | |
| G06F 13/16 | (2006.01) | |
| G06F 13/28 | (2006.01) | |
| H03M 13/11 | (2006.01) | |
| H03M 13/15 | (2006.01) | |

(52) U.S. Cl.
CPC ........ *G06F 3/0679* (2013.01); *G06F 11/1048* (2013.01)

(58) Field of Classification Search
CPC .......................... G06F 11/1048; G06F 3/0679
See application file for complete search history.

(56) References Cited

U.S. PATENT DOCUMENTS

| | | | |
|---|---|---|---|
| 8,495,332 B2 * | 7/2013 | Wakrat | G06F 12/0246 711/135 |
| 9,063,889 B2 * | 6/2015 | Conti | G06F 12/1433 |
| 9,116,832 B2 | 8/2015 | Grube et al. | |
| 10,275,222 B2 * | 4/2019 | Anderson | G06F 8/24 |
| 10,613,934 B2 | 4/2020 | Kalos et al. | |
| 10,922,172 B2 | 2/2021 | Margetts | |
| 2007/0171730 A1 * | 7/2007 | Ramamoorthy | H03M 13/1515 365/185.33 |
| 2022/0189574 A1 * | 6/2022 | Amato | G11C 29/10 |
| 2023/0121992 A1 * | 4/2023 | Kim | G11C 7/1093 365/191 |

* cited by examiner

*Primary Examiner* — Guy J Lamarre
(74) *Attorney, Agent, or Firm* — Brooks, Cameron & Huebsch, PLLC

(57) ABSTRACT

Some memory dice in a stack can be connected externally to the stack and other memory dice in the stack can be connected internally to the stack. The memory dice that are connected externally can act as interface dice for other memory dice that are connected internally thereto. Data protection and recovery schemes provided for the stacks of memory dice can be based on data that are transferred in a single data stream without a discontinuity between those data transfers from the memory dice of the stacks.

20 Claims, 11 Drawing Sheets ies thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

DATA PROTECTION FOR STACKS OF MEMORY DICE

TECHNICAL FIELD

The present disclosure relates generally to semiconductor memory and methods, and more particularly, to apparatuses, systems, and methods for data protection for stacks of memory dice.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, ferroelectric random access memory (FeRAM), and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system. A controller may be used to manage the transfer of data, commands, and/or instructions between the host and the memory devices.

DETAILED DESCRIPTION

Figure 1:
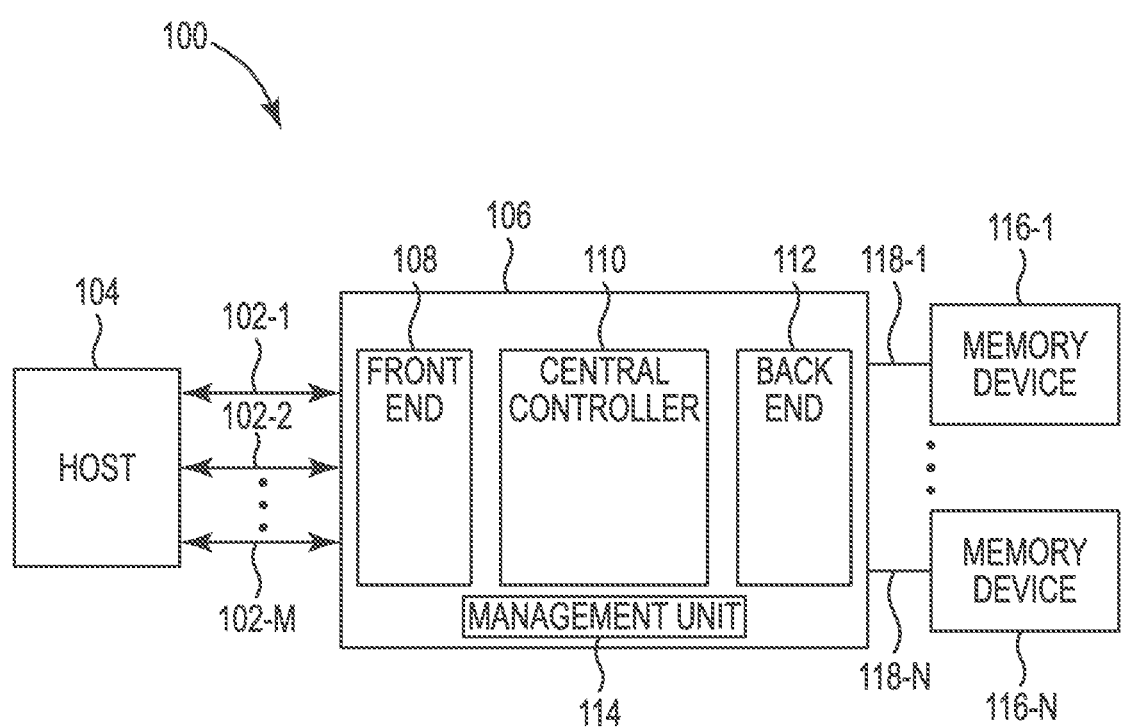
FIG. 1 is a block diagram of a computing system in accordance with a number of embodiments of the present disclosure.

Systems, apparatuses, and methods related to data protection for stacks of memory dice are described. In some embodiments, some memory dice in a stack can be connected externally to the stack and other memory dice in the stack can be connected internally to the stack. The memory dice that are connected externally can act as interface dice for other memory dice that are connected internally thereto. In some embodiments, the external connections are used for transmitting signals indicative of data to and/or from the memory dice while the memory dice in the stack are connected by a cascading connection for transmission of other signals such as command, address, power, ground, etc. As used herein, those memory dice that are internally coupled to one another can be referred to as a memory unit.

Embodiments of the present disclosure provide data protection and recovery schemes for the stacks of memory dice described above for providing data protection and recovery schemes. The data protection and recovery schemes can be provided by a "chip kill," in which the memory system can work properly even if a constituent chip, such as one or more memory dice, are damaged; thereby, avoiding a situation of one of the chips being a single point of failure (SPOF) of the memory system. The chip kill is provided based on data distributed over memory dice of the stacks. The data from different memory dice of the stacks are transferred in a single data stream without a discontinuity between those data transfers from the memory dice.

In some embodiments, the memory system can be a compute express link (CXL) compliant memory system. The host interface can be managed with CXL protocols and be coupled to the host via a peripheral component interconnect express (PCIe) interface. CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost in comparison to approaches that do not employ CXL protocols. CXL is designed to be an industry open standard interface for high-speed communications, as accelerators are increasingly used to complement CPUs in support of emerging applications such as artificial intelligence and machine learning. CXL technology is built on the PCIe infrastructure, leveraging PCIe physical and electrical interfaces to provide advanced protocol in areas such as input/output (I/O) protocol, memory protocol (e.g., initially allowing a host to share memory with an accelerator), and coherency interface.

As used herein, the singular forms "a," "an," and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 336 may reference element "36" in FIG. 3, and a similar element may be referenced as 536 in FIG. 5. Analogous elements within a Figure may be referenced with a hyphen and extra numeral or letter. See, for example, elements 116-1, . . . , 116-N in FIG. 1. Such analogous elements may be generally referenced without the hyphen and extra numeral or letter. For example, elements 116-1, . . . , 116-N may be collectively referenced as 116. As used herein, the designators "M," "N," and "P," particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention and should not be taken in a limiting sense.

FIG. 1 is a block diagram of a computing system 100 in accordance with a number of embodiments of the present disclosure. The computing system 100 can include a memory controller 106 having a front end portion 108, a central controller portion 110, and a back end portion 112. The computing system 100 can include a host 104 and memory devices 116-1, . . . , 116-N coupled to the memory controller 106.

The front end portion 108 includes an interface and interface management circuitry to couple the memory controller 106 to the host 104 through input/output (I/O) lanes 102-1, 102-2, . . . , 102-M and circuitry to manage the I/O lanes 102. There can be any quantity of I/O lanes 102, such as eight, sixteen, or another quantity of I/O lanes 102. In some embodiments, the I/O lanes 102 can be configured as a single port. In at least one embodiment, the interface between the memory controller 106 and the host 104 can be a PCIe physical and electrical interface operated according to a CXL protocol.

The central controller portion 110 can include and/or be referred to as data management circuitry. The central controller portion 110 can control, in response to receiving a request from the host 104, performance of a memory operation. Examples of the memory operation include a read operation to read data from a memory device 116 or a write operation to write data to a memory device 116.

The central controller portion 110 can generate error detection information and/or error correction information based on data received from the host 104 (e.g., host data). The error correction information that can be generated at the central controller portion 110 can be of different types of error correction information. For example, a first type of the error correction information can be for correcting a quantity of errors within a respective subset of host data and a second type of the error correction information can be for correcting those errors that were not correctable using the first type of the error correction information.

In one example, the error correction information having the second type can be parity for performing a chip kill operation. The term "chip kill" generally refers to a form of error correction that protects computing systems (e.g., the computing system 100) from any single memory device 116 (chip) failure as well as multi-bit error from any portion of a single memory chip. Although embodiments are not so limited, the chip kill capability can be provided through low-power chip kill (LPCK) scheme. The LPCK scheme can be implemented collectively across subsets of the memory devices 116 or across all of the memory devices 116. As used herein, the term "chip kill operation" and "error correction operation" can be used interchangeably here and can have the same meaning, as appropriate to the context.

The error detection information can be utilized to determine whether errors within the respective subset were corrected or were uncorrectable using the first type of error correction information described above. An example of an error detection operation is a cyclic redundancy check (CRC) operation. CRC may be referred to as algebraic error detection. CRC can include the use of a check value resulting from an algebraic calculation using the data to be protected. CRC can detect accidental changes to data by comparing a check value stored in association with the data to the check value calculated based on the data.

Error correction information of different types can be distributed over the memory devices 116 in various manners. In one example, the error correction information having the first type can be stored in the same chip (e.g., the memory device 116) as host data associated with the error correction information. More specifically, each memory device 116 can include a dedicated portion (e.g., the portions 724-1-2, 724-2-2, 724-3-2, and/or 724-4-2 illustrated in FIG. 7) configured for the error correction information having the first type. In one example, the memory devices 116 can include a dedicated chip (e.g., one or more memory dice of the stack 860-5 or 960-3 illustrated in FIG. 8 and FIG. 9, respectively) configured for the error correction information having the second type (e.g., LPCK parity). Additional detail regarding the LPCK parity configuration over memory devices is described below with respect to FIG. 8 and FIG. 9.

The back end portion 112 can include a media controller and a physical (PHY) layer that couples the memory controller 106 to the memory devices 116. As used herein, the term "PHY layer" generally refers to the physical layer in the Open Systems Interconnection (OSI) model of a computing system. The PHY layer may be the first (e.g., lowest) layer of the OSI model and can be used to transfer data over a physical data transmission medium. In some embodiments, the physical data transmission medium can include channels 118-1, . . . , 118-N. The channels 118 can include a sixteen-pin data bus and a two-pin data mask inversion (DMI) bus, among other possible buses. As used herein, one or more pins forming a data bus are referred to as "data pin" or "data pins" and one or more pins forming a DMI bus are referred to as "DMI pin" or "DMI pins". The back end portion 112 can exchange (e.g., transmit or receive) data with the memory devices 116 via the data pins and exchange error detection information and/or error correction information with the memory devices 116 via the DMI pins. The error detection information and/or error correction information can be exchanged simultaneously with the exchange of data.

An example of the memory devices 116 is dynamic random access memory (DRAM) such as low-power double data rate (LPDDR) memory. In at least one embodiment, at least one of the memory devices 116 is operated as an LPDDR DRAM device with low-power features disabled. In some embodiments, although the memory devices 116 are LPDDR memory devices, the memory devices 116 do not include circuitry configured to provide low-power functionality for the memory devices 116 such as bank group, or other low-power functionality providing circuitry. Providing the LPDDR memory devices 116 without such circuitry can advantageously reduce the cost, size, and/or complexity of the LPDDR memory devices 116.

In some embodiments, the memory controller 106 can include a management unit 114 to initialize, configure, and/or monitor characteristics of the memory controller 106. The management unit 114 can include an I/O bus to manage out-of-band data and/or commands, a management unit controller to execute instructions associated with initializing, configuring, and/or monitoring the characteristics of the memory controller, and a management unit memory to store data associated with initializing, configuring, and/or monitoring the characteristics of the memory controller 106. As used herein, the term "out-of-band" generally refers to a transmission medium that is different from a primary transmission medium of a network. For example, out-of-band data and/or commands can be data and/or commands transferred to a network using a different transmission medium than the transmission medium used to transfer data within the network.

Figure 2:
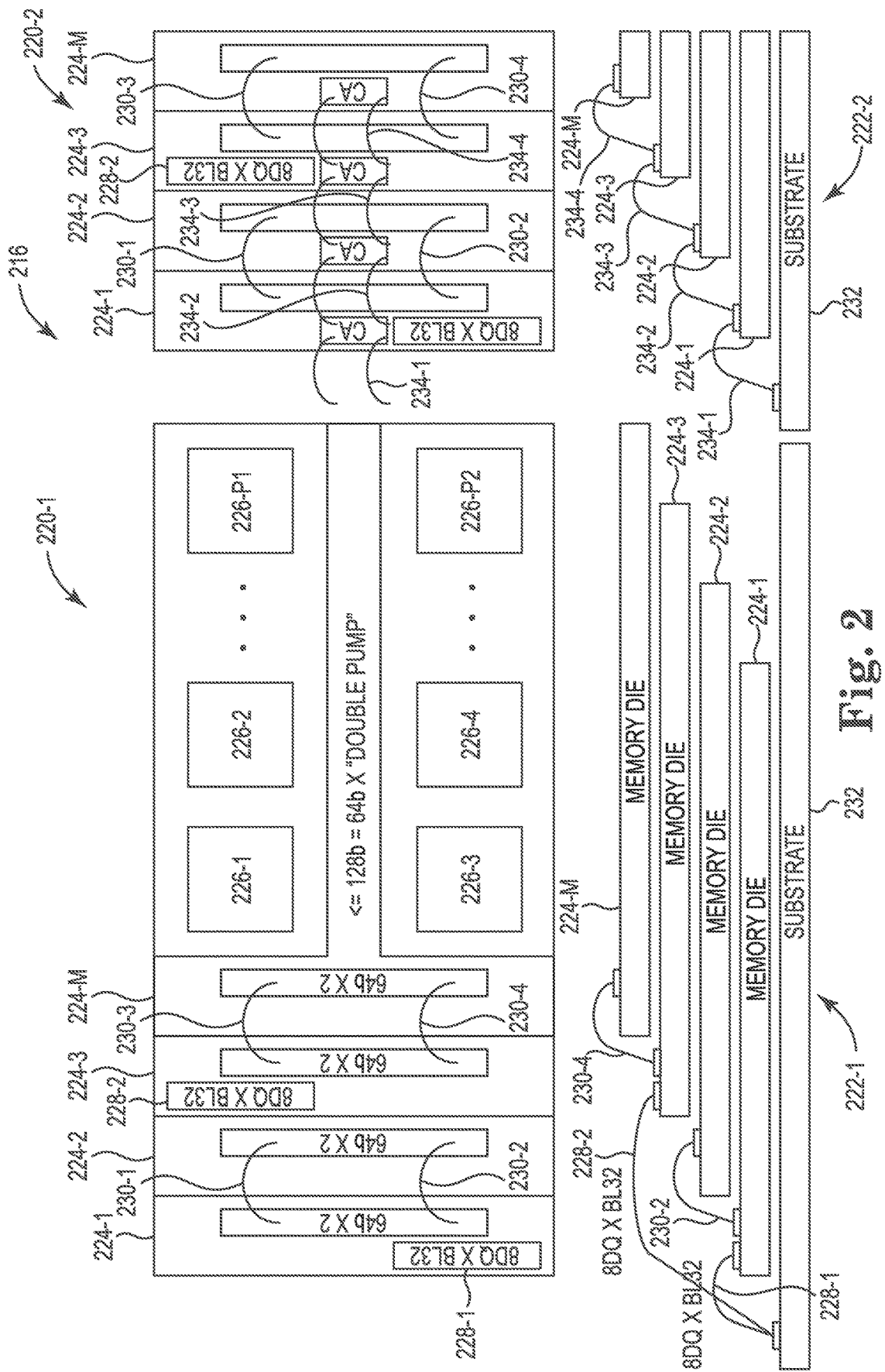
FIG. 2 is a block diagram of a memory device architecture in accordance with a number of embodiments of the present disclosure.

FIG. 2 is a block diagram of a memory device 216 architecture in accordance with a number of embodiments of the present disclosure. The block diagram includes a first partial top view 220-1 illustrating various connections for data transfer and a second partial top view 220-2 illustrating various connections for command/address (CA) signaling. The block diagram also includes a first partial side view 222-1 illustrating various connections for data transfer and a second partial side view 222-2 illustrating various connections for CA signaling.

The memory device 216 includes stacked memory dice 224-1, 224-2, 224-3, . . . , 224-M formed on a substrate 232. Although four memory dice 224 are illustrated, embodiments are not so limited. Stacked memory dice 224 allow for increased memory capacity without significant expansion laterally by stacking the memory dice 224 vertically. In the first partial top view 220-1, the memory die 224-M is illustrated with various memory banks 226-1, 226-2, . . . , 226-P1, and 226-3, 226-4, . . . , 226-P2. Although not specifically illustrated, the memory dice 224-1, 224-2, 224-3 include memory banks 226 analogous to those illustrated for the memory die 224-M.

A memory bank 226 can include one or more memory arrays, such as a DRAM array, SRAM array, STT RAM array, PCRAM array, TRAM array, RRAM array, NAND flash array, NOR flash array, and/or 3D cross-point array for instance. The array can include memory cells arranged in rows coupled by access lines (which may be referred to herein as word lines or select lines) and columns coupled by sense lines (which may be referred to herein as digit lines or bit lines). Address signals are received and decoded by a row decoder and a column decoder to access the memory array. Data can be read from memory array by sensing voltage and/or current changes on the sense lines using sensing circuitry. The sensing circuitry is coupled to the memory array. The sensing circuitry can comprise, for example, sense amplifiers that can read and latch a page (e.g., row) of data from the memory array.

Although not specifically illustrated, the substrate 232 can include control circuitry for the memory dice 224. Control circuitry can decode signals provided by a host. The signals can be commands provided by the host. These signals can include chip enable signals, write enable signals, and address latch signals that are used to control operations performed on the memory array, including data read operations, data write operations, and data erase operations. The control circuitry can be a state machine, a sequencer, and/or some other type of control circuitry, which may be implemented in the form of hardware, firmware, or software, or any combination of the three.

In contrast to some previous approaches, each memory die 224 is not coupled to the substrate 232 by an independent data input/output (also referred to in the art as a "DQ"). Instead, some memory dice 224 are coupled to the substrate 232 by an external data link 228 and some memory dice 224 are coupled to other memory dice 224 by an internal data link 230. As illustrated, the first memory die 224-1, which is on the substrate 232, includes a first external data link 228-1 to the substrate 232. The second memory die 224-2, which is on the first memory die 224-1, includes a first internal data link 230-1, 230-2 to the first memory die 224-1. The third memory die 224-3, which is on the second memory die 224-2, includes a second external data link 228-2 to the substrate 232. The fourth memory die 224-M, which is on the third memory die 224-3, includes a second internal data link 230-3, 230-4 to the third memory die 224-3. The memory die that includes an external data link, such as the external data links 228-1, 228-2, can be referred to as a primary memory die, while the memory die includes an internal data link, such as the internal data link 230-1, 230-2 can be referred to as a secondary memory die.

Each of the internal data links 230 can include one or more than one physical connection. As illustrated in FIG. 2, the first internal data link 230-1, 230-2 includes two physical connections and the second internal data link 230-3, 230-4 includes two physical connections (e.g., for communication of signals indicative of data). The second memory die 224-2 can be coupled to the first memory die 224-1 via a first pair of internal data links 230-1, 230-2 (e.g., each serving a respective portion of the memory banks of the second memory die 224-2). The fourth memory die 224-M can be coupled to the third memory die 224-3 via a second pair of internal data links 230-3, 230-4 (e.g., each serving a respective portion of the memory banks 226 of the fourth memory die 224-M).

The second memory die 224-2 is configured to communicate signals indicative of data via the first internal data link 230-1. The fourth memory die 224-M is configured to communicate signals indicative of data via the second internal data link 230-2. The first memory die 224-1 is configured to communicate signals indicative of data from (e.g., stored by) the first memory die 224-1 and the signals indicative of data from (e.g., stored by) the second memory die 224-2 via the first external data link 228-1. The third memory die 224-3 is configured to communicate signals indicative of data from (e.g., stored by) the third memory die 224-3 and the signals indicative of data from (e.g., stored by) the fourth memory die 224-M via the second external data link 228-2. In some embodiments, each of the transfers can be controlled by control circuitry on the substrate 232 or coupled to the substrate 232. In at least one embodiment, the first external data link 228-1 and the second external data link 228-2 are operated as a single channel.

As described herein, the memory unit can refer to a set of primary and secondary memory dice that are coupled to one another via an internal data link (e.g., one or more of the internal data links 230). For example, embodiment illustrated in FIG. 2 can include two memory units (that are formed on the substrate 232): a first memory unit including the primary memory die 224-1 and the secondary memory die 224-2 and a second memory unit including the primary memory die 224-3 and the secondary memory die 224-M.

CA signals can be exchanged with the memory dice 224 from the substrate 232 by a cascaded wire bonding. As illustrated, the first memory die 224-1 is coupled to the substrate 232 by a first CA link 234-1. The second memory die 224-2 is coupled to the first memory die 224-1 by a second CA link 234-2. The third memory die 224-3 is coupled to the second memory die 224-2 by a third CA link 234-3. The fourth memory die 224-M is coupled to the third memory die 224-3 by a fourth CA link 234-4. Although not specifically illustrated, the substrate 232 can include control circuitry configured to provide CA signals to the first memory die 224-1 via the first CA link 234-1. The control circuitry can be configured to provide CA signals to the second memory die 224-2 via the first CA link 234-1 and the second CA link 234-2. The control circuitry can be configured to provide CA signals to the third memory die 224-3 via the first CA link 234-1, the second CA link 234-2, and the third CA link 234-3. The control circuitry can be configured to provide CA signals to the fourth memory die 224-M via the first CA link 234-1, the second CA link 234-2, the third CA link 234-3, and the fourth CA link 234-4. The CA links 234 can also provide power and ground connections for the memory dice 224. In some embodiments, on die termination is provided in parallel for each pair of memory dice 224. Each of the CA links 234 can include one or more than one physical connection. As illustrated in FIG. 2, each of the CA links 234 includes two physical connections (not separately labeled with reference numerals), however embodiments are not so limited. The pairs of physical connections for each CA link 234 can be used for separate CA signaling for embodiments operated with more than one rank per channel. As used herein, the term "rank" generally refers to a plurality of memory chips (e.g., DRAM memory chips and/or FeRAM memory chips) that can be accessed simultaneously.

The external data links 228 can each be made up of a respective quantity of data lines (DQs), which may also be referred to as pins or pads. For example, each external data link 228 can include 8 DQs. The DQs can be operated with a burst length (e.g., a 32-bit burst length "BL"). A burst is a series of data transfers over multiple cycles, such as beats. As used herein, the term "beat" refers to a clock cycle increment during which an amount of data equal to the width of the memory bus may be transmitted. For example, 32-bit burst length can be made up of 32 beats of data transfers.

In the example illustrated in FIG. 2 "8DQ×32BL" means that the 8 DQs are operated with a burst length of 32 bits for each external data link 228 (e.g., transfer of 8 bits for each one of 32 beats), for a total output of 256 bits per external data link 228. The 256 bits per external data link 228 per burst can be made up of 128 bits from each of two memory dice 224. With two external data links 228-1, 228-2, the memory device 216 can transfer signals indicative of 512 bits of data per channel during the burst length (e.g., for read or write operations). The 128 bits per memory die 224 can be made up of two separate data transfers of 64 bits each (128 bits=64 bits×2). In some embodiments, the total burst length can be divided into two or four portions (e.g., the 32-bit burst length can be divided into two 16 bits burst lengths or four 8-bit burst lengths). The total 32-bit burst length also represents two bursts of burst length 16 bits from each memory die 224.

In some approaches, when a total burst length is split between different memory dice, one or more clock cycles are included as "bubbles" between the data transfers associated with each portion of the burst. For example, the bubble can be used to allow time for rank-to-rank signal switching and/or internal memory die configuration. Specifically, the bubble can allow for a faster read/write clock to be synchronized with a slower CA clock. However, various embodiments of the present disclosure do not include such a clock bubble between different portions of the burst length, thereby reducing latency. Additional detail regarding timing is described below with respect to FIG. 4 and FIG. 6.

In one example, the first memory die 224-1 is configured to communicate via the first external data link 228-1 a first signal indicative of data from (e.g., stored by) the first memory die 224-1 during a first portion of the burst length (e.g., a first 16 bit burst length) and a second signal indicative of data from (e.g., stored by) the second memory die 224-2 during a second portion of the burst length (e.g., a second 16 bit burst length). During the first portion of the burst length, the data from the second memory die 224-2 can be prefetched (e.g., transferred from the second memory die 224-2 to the first memory die 224-1 via the first internal data link 230-1, 230-2 during the first portion of the burst length). Analogously and/or contemporaneously, the third memory die 224-3 is configured to communicate via the second external data link 228-2 a third signal indicative of data from (e.g., stored by) the third memory die 224-3 during the first portion of the burst length (e.g., a first 16 bit burst length) and a fourth signal indicative of data from (e.g., stored by) the fourth memory die 224-M during the second portion of the burst length (e.g., a second 16 bit burst length). During the first portion of the burst length, the data from the fourth memory die 224-M can be prefetched (e.g., transferred from the fourth memory die 224-M to the third memory die 224-3 via the first internal data link 230-1, 230-2 during the first portion of the burst length).

In one example, the first memory die 224-1 is configured to communicate via the first external data link 228-1 a first signal indicative of data from (e.g., stored by) the first memory die 224-1 during a first portion of the burst length (e.g., a first 8 bit burst length), a second signal indicative of data from (e.g., stored by) the second memory die 224-2 during a second portion of the burst length (e.g., a second 8 bit burst length), a third signal indicative of data from (e.g., stored by) the first memory die 224-1 during a third portion of the burst length (e.g., a third 8 bit burst length), and a fourth signal indicative of data from (e.g., stored by) the second memory die 224-2 during a fourth portion of the burst length (e.g., a fourth 8 bit burst length). During the first and third portions of the burst length, the data from the second memory die 224-2 can be prefetched (e.g., transferred from the second memory die 224-2 to the first memory die 224-1 via the first internal data link 230-1, 230-2). Analogously and/or contemporaneously, the third memory die 224-3 is configured to communicate via the second external data link 228-2 a fifth signal indicative of data from (e.g., stored by) the third memory die 224-3 during the first portion of the burst length ("1′ BL8), a sixth signal indicative of data from (e.g., stored by) the fourth memory die 224-M during the second portion of the burst length, a seventh signal indicative of data from (e.g., stored by) the third memory die 224-3 during the third portion of the burst length, and an eighth signal indicative of data from (e.g., stored by) the fourth memory die 224-M during the fourth portion of the burst length. During the first and third portions of the burst length, the data from the fourth memory die 224-M can be prefetched (e.g., transferred from the fourth memory die 224-M to the third memory die 224-3 via the first internal data link 230-1, 230-2).

Although not specifically illustrated in FIG. 2, the timing of the DQs can be controlled with a first clock and the timing of at least one of the CA links 234 can be controlled with a second clock. In at least one embodiment, the first clock can operate at a higher frequency than the second clock. For example, the first clock can operate four times faster than the second clock such that reads or writes of data can occur with one transfer (signal indicative of data) per cycle of the first clock and one transfer (CA signals) per cycle of the second clock. In this example, the CA signal can be a quadruple load and the signal indicative of data can be a single load.

At least one embodiment of the present disclosure provides advantages over LPDDR memory device operation, while maintaining compliance with an LPDDR standard. For example, a relatively lesser quantity of memory ranks can improve read/write operation (e.g., read-to-read command timing). A clock bubble between portions of a total burst length may not be used, thereby improving latency in comparison to traditional LPDDR memory device paradigms. Further, column address to column address delay requirements (tCCD) can be relaxed and/or lower prefetch sizes per die can be used in comparison to traditional LPDDR approaches. In some embodiments, various features of LPDDR are not used, such as bank groups (thereby reducing timing constraints and metal resources and/or costs), dynamic operations such as on the fly (OTF) switching between burst modes without a command, burst ordering, etc.

Figure 3:
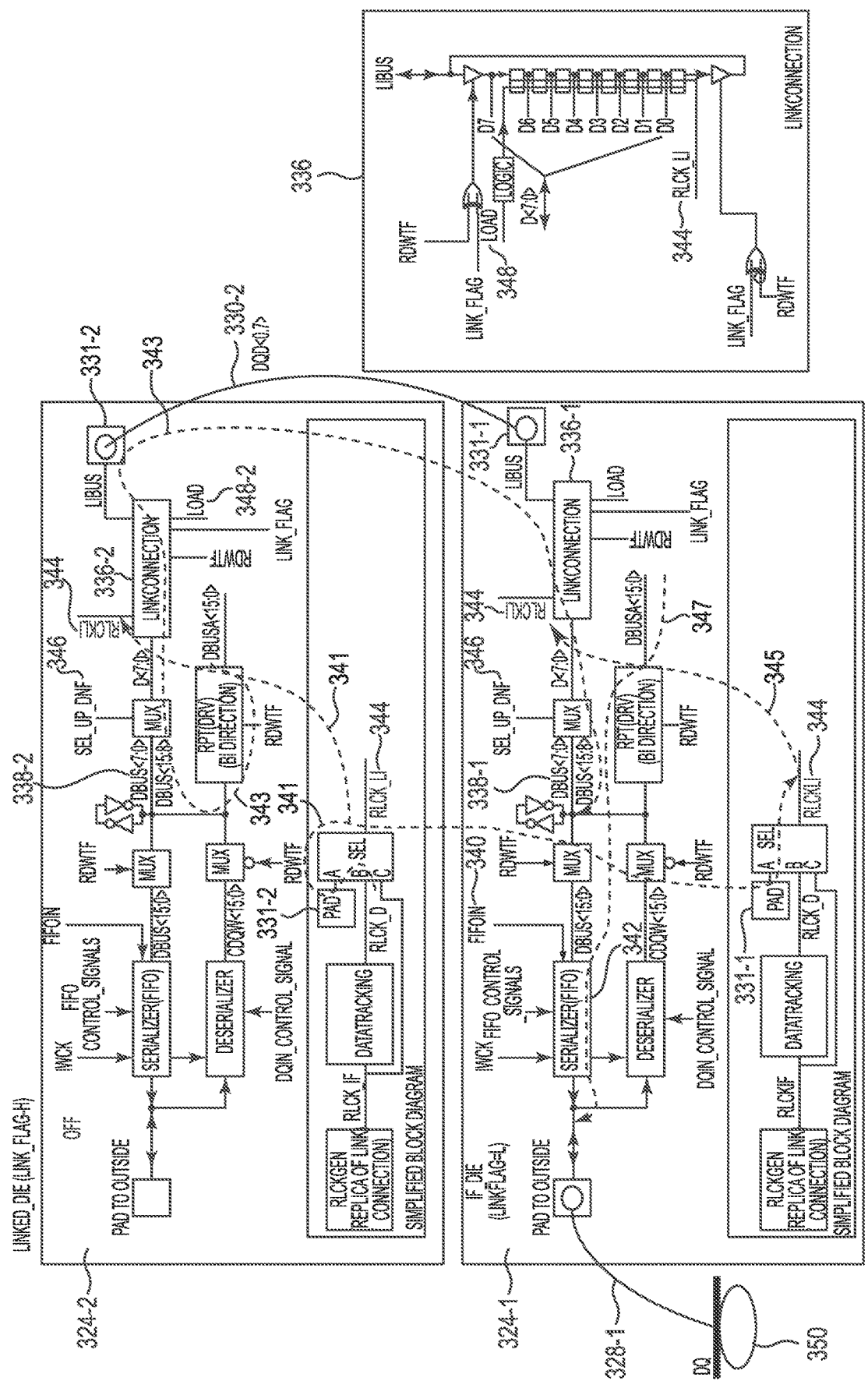
FIG. 3 is a block diagram of a link architecture between memory dice illustrating a read operation in accordance with a number of embodiments of the present disclosure.

FIG. 3 is a block diagram of a link architecture between memory dice 324-1, 324-2 illustrating a read operation in accordance with a number of embodiments of the present disclosure. The first memory die 324-1 is analogous to the first memory die 224-1 and/or the third memory die 224-3 illustrated in FIG. 2. The second memory die 324-2 is analogous to the second memory die 224-2 and/or the fourth memory die 224-4 illustrated in FIG. 2. For ease of explanation, reference will generally be made to the first and second memory dice. Furthermore, the first and third memory dice are occasionally referenced as interface dice while the second and fourth memory dice are occasionally referenced as linked dice with respect to FIGS. 3-6.

The first memory die 324-1 is coupled via an external data link 328-1 to a DQ 350. The memory dice 324 can be fabricated identically and then later connected externally (e.g., to a substrate, interposer, host, etc.) and/or internally with other memory dice 324. For example, the internal components of the memory dice 324 can be identical (e.g., the second memory die 324-2 includes a "pad to outside" even though it is not connected). As illustrated, for the second memory die 324-2, which does not have an external data link, the "pad to outside," serializer FIFO, deserializer, and the pair of multiplexors can all be powered down as indicated by "OFF" in the second memory die 324-2 in FIG. 3. The corresponding components of the first memory die 324-1 can be powered up. Such embodiments can improve fabrication efficiency in comparison to other approaches described herein.

In FIG. 3, the bottom box "simplified block diagram" illustrated in each memory die 324 presents a simplified view of the signaling and logic to operate the memory die 324. For example, the blocks labeled "PAD" 331-1, 331-2 in the simplified block diagram are indicative of the blocks connected to the internal data link bus "LIBUS" as indicated at 331-1, 331-2 in the top right corner of each memory die 324. The second memory die 324-2 is coupled to the first memory die 324-1 via an internal data link 330-2, which can also be referred to as an internal DQ "DQD<0:7>". The pads 331 are connected to the internal data link 330-2 between the memory dice 324.

The pads 331 are connected to link connection circuitry 336-1, 336-2 via respective link buses. A more detailed illustration of the link connection circuitry 336 is illustrated in the block on the right side of FIG. 3. Inputs to the link connection circuitry 336 include the signals RDWTF, LINK FLAG, LOAD 348, RLCKLI 344. The link connection circuitry 336-2 in the second memory die 324-2 is illustrated having the signal LOAD 348-2, which corresponds to the LOAD(LINKED DIE) signal 448-2 illustrated in FIG. 4. The link connection circuitry 336 also includes data input/output labeled as "D<7:0>", representing an 8 bit wide data bus, and the input/output to the LIBUS. The D<7:0> bus from the link connection 336 circuitry is connected to a multiplexor controlled by a signal SEL_UP_DNF 346.

The link connection circuitry 336 can operate according to the following truth table:

TABLE 1

| Case | Link Flag | RDWTF | Load |
|------|-----------|-------|------|
| 1    | Low       | High  | Low  |
| 2    | High      | High  | High |
| 3    | Low       | Low   | High |
| 4    | High      | Low   | Low  |

The RDWTF signal effectively indicates whether a read or write operation is being performed. Case 1 and case 2 can be used as part of a read operation. Case 3 and case 4 can be used as part of a write operation and are described in more detail with respect to FIGS. 5-6. In case 2, the signal RLCK_D is transferred to the pad 331 according to the signal RLCKLI 344 as indicated in FIG. 3 by the dotted lines 341. Case 2 can be applied to the second memory die 324-2 to transfer a signal indicative of data from (e.g., stored by) the second memory die 324-2 via the internal data link 330-2 to the first memory die 324-1 as indicated in FIG. 3 by the dotted line 343. The dotted line 343 also indicates the path of data from the memory array of the second memory die 324-2, through the link connection circuitry 336-2, through the pad 331-2, through the internal data link 330-2, through the pad 331-1, through the link connection 336-1 to the serializer 342-1. While the signals indicative of data from (e.g., stored by) the second memory die 324-2 are being transferred via the internal data link 330-2 to the first memory die 324-1, data from the first memory die 324-1 can be transferred to the external data link 328-1 as indicated by the dotted line 347.

In case 1, a signal is received from the pad 331 according to the signal RLCKLI signal 344 as indicated in FIG. 3 by the dotted line 345. Case 1 can be applied to the second memory die 324-2 to receive the signal sent according to case 1 from the second memory die 324-2 via the internal data link 330-2 and the pad 331-2 by the first memory die 324-1.

As part of the read operation, signals indicative of the data from (e.g., stored by) the first memory die 324-1 reach the first in first out (FIFO) serializer 342 followed by signals indicative of the data from (e.g., stored by) the second memory die 324-2. The signals indicative of data are transferred from the FIFO 342 to the "PAD TO OUTSIDE" and transferred to the DQ 350 via the external data link 328-1.

Figure 4:
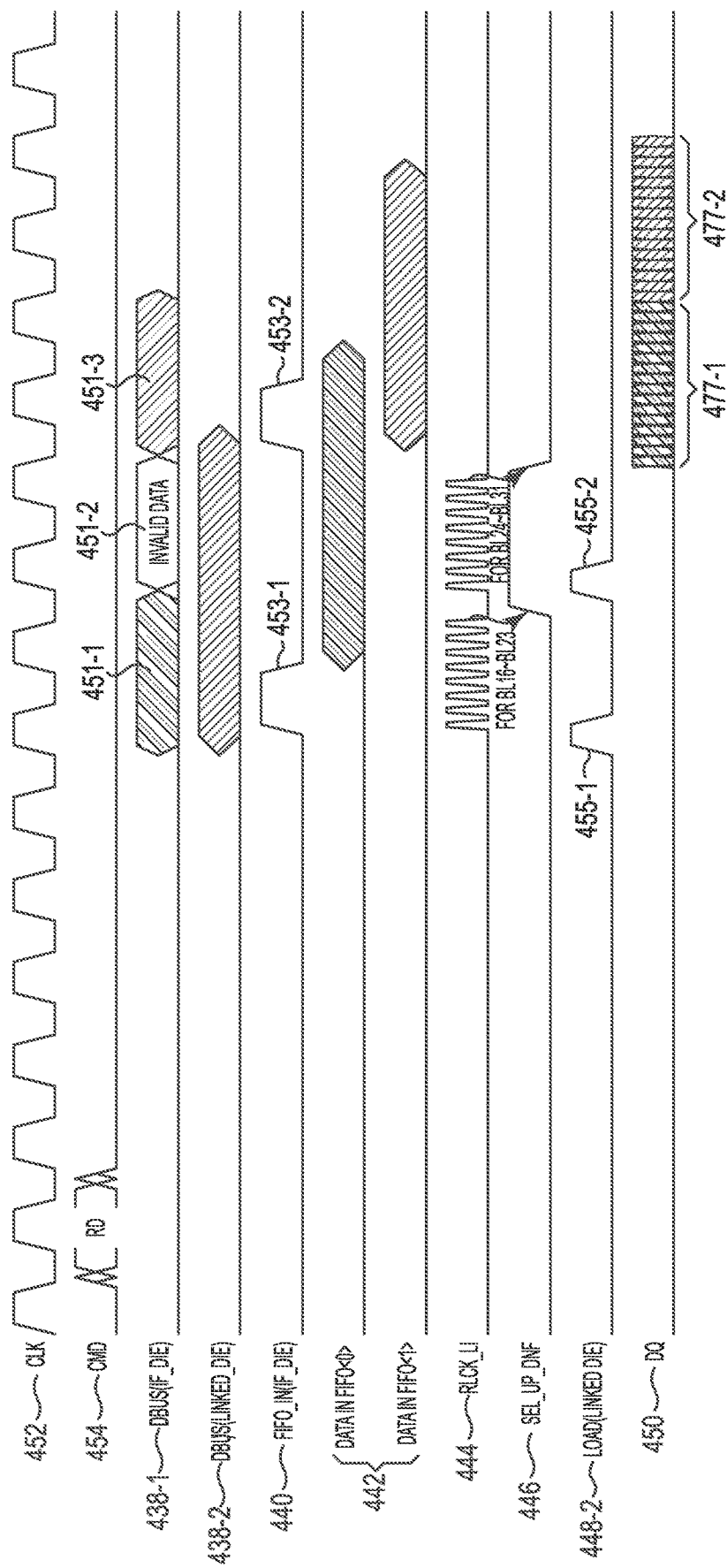
FIG. 4 is a timing diagram for a read operation in accordance with a number of embodiments of the present disclosure.

FIG. 4 is a timing diagram for a read operation in accordance with a number of embodiments of the present disclosure. The timing diagram corresponds to the read operation illustrated with respect to the diagram of the link architecture between memory dice illustrated in FIG. 3. In FIG. 4, the clock signal 452 represents a system clock such as a CA clock. A read command can be issued as indicated by "RD" in the command signal 454. The read clock 444 can operate at a greater frequency than the CA clock as indicated in the read clock signal RLCK_LI 444.

The load signal 448-2 corresponds to the signal 348-2 associated with the link connection 336-2 of the second memory die 324-2 in FIG. 3. The load signal 448-2 on the second memory die can go high when both the link flag signal and the RDWTF signal match, as described above with respect to FIG. 3. As illustrated in FIG. 4, two loads are triggered according to the load signal 448-2. The first trigger 455-1 on the load signal 448-2 corresponds to the start of the first burst on the read clock 444. The start of the second trigger 455-2 on the load signal 448-2 corresponds to the start of the second burst on the read clock 444. The end of the first burst on the read clock 444 corresponds to the signal SEL_UP_DNF 446 going high and the end of the second burst on the read clock 444 corresponds to the signal SEL_UP_DNF 446 going low. With respect to FIG. 3, the signal SEL_UP_DNF 346 is applied to a multiplexor in the first memory die 324-1 to control multiplexing of different bursts.

The first trigger 455-1 on the load signal 448-2 also corresponds to a first trigger on the signal FIFO_IN 440 of the first memory die.

Contemporaneously, signals indicative of data beginning to be transferred on the data buses ("DBUS") of the first die as indicated by the first eye 451-1 on the DBUS(IF_DIE) 438-1 and of the second die as indicated by the eye on the DBUS(LINKED_DIE) 438-2. With respect to FIG. 3, this corresponds to signals indicative of data being transferred on the data bus 338-1 of the first memory die 324-1 (indicated by a portion of the dotted line 347) and on the data bus 338-2 of the second memory die 324-2 (indicated by a portion of the dotted line 343). As described above, signals indicative of the data from (e.g., stored by) the second memory die are transferred to the first memory die and make their way to the data bus of the first memory die. This is indicated in FIG. 4 by the third eye 451-3 on the data bus 438-1. The second eye 451-2 on the data bus 438-1 represents invalid data that is not transferred to the FIFO because the signal FIFI_IN (IF_DIE) 440 is only triggered in conjunction with the first eye 451-1 and the third eye 451-3.

The signal FIFO_IN 440 is applied to the serializer FIFO 342 of the first memory die 324-1 illustrated in FIG. 3. The end of the first trigger 453-1 on the signal FIFO_IN 440 corresponds to an opening of the eye on the DATA IN FIFO<0>442, which represents signals indicative of data from (e.g., stored by) the first memory die being present in the FIFO. The start of the second trigger 453-2 on the signal FIFO_IN 440 corresponds to the opening of the eye on the DATA IN FIFO<1>442, which represents signals indicative of data from (e.g., stored by) the second memory die being present in the FIFO. The end of the second trigger 453-2 on the signal FIFO_IN 440 corresponds to the closing of the eye on the DATA IN FIFO<0>442. Although illustrated on separate lines for clarity, the DATA IN FIFO<0> and DATA IN FIFO<1> can both correspond to the FIFO 342 of the first memory die 324-1 in FIG. 3.

The DQ line 450 illustrates signals indicative of data being transferred via the external data link 328-1 to the DQ 350 as illustrated in FIG. 3. The DQ line 450 illustrates first signals 477-1 indicative of data originating from the first memory die and second signals 477-2 indicative of data originating from the second memory die.

Figure 5:
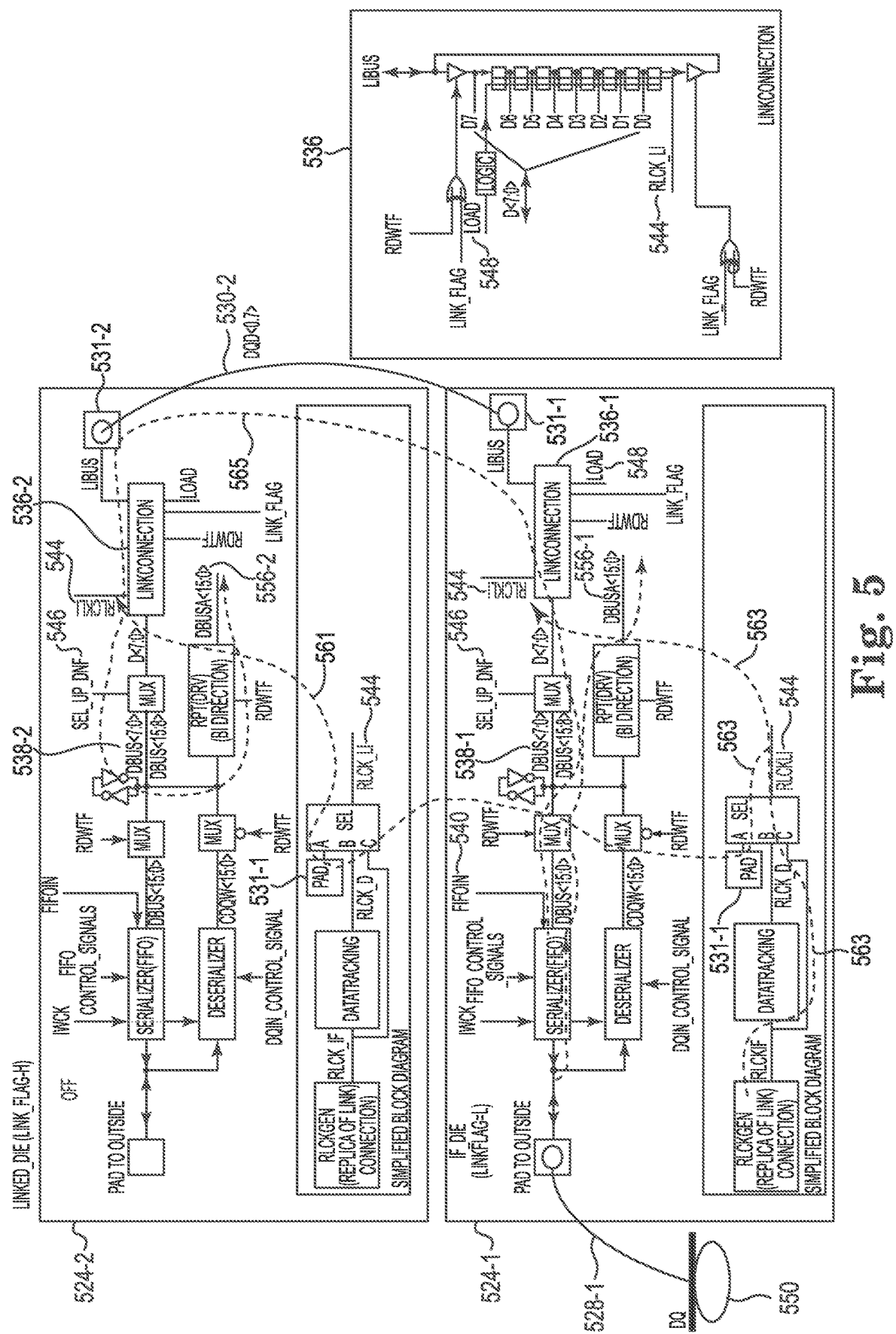
FIG. 5 is a block diagram of a link architecture between memory dice illustrating a write operation in accordance with a number of embodiments of the present disclosure.

FIG. 5 is a block diagram of a link architecture between memory dice illustrating a write operation in accordance with a number of embodiments of the present disclosure. The first memory die 524-1 is coupled via an external data link 528-1 to a DQ 550. As illustrated, for the second memory die 524-2, which does not have an external data link, the "pad to outside," serializer FIFO, deserializer, and the pair of multiplexors can all be powered down as indicated by "OFF" in the second memory die 524-2 in FIG. 5. The corresponding components of the first memory die 524-1 can be powered up.

The pads 531-1, 531-2 are connected to link connection circuitry 536-1, 536-2 via respective link buses. Inputs to the link connection circuitry 536 include the signals RDWTF, LINK FLAG, LOAD 548, RLCKLI 544. The link connection circuitry 536-1 in the first memory die 524-1 is illustrated having the signal LOAD 548-1, which corresponds to the signal LOAD(LINKED DIE) 648-1 illustrated in FIG. 6. The link connection circuitry 536 also includes data input/output labeled as "D<7:0>," representing an 8 bit wide data bus, and the input/output to the LIBUS. The D<7:0> bus from the link connection 536 circuitry is connected to a multiplexor controlled by a signal SEL_UP_DNF 546.

The link connection circuitry 536 can operate according to Table 1. With reference to Table 1 above, case 3 and case 4 can be used as part of a write operation. In case 3, the signal RLCKIF (indicative of data being sent to the interface die) is transferred to the pad 531 according to the signal RLCKLI 544 as indicated in FIG. 5 by the dotted line 563. In case 4, a signal is transferred to the pad 531-2 according to the signal RCLKLI 544 as illustrated by the dotted line 561. Case 4 can be applied to the second memory die 524-2 to write data to the second memory die 524-2 from the first memory die 524-1. The dotted line 565 indicates the path of data from the serializer and/or deserializer of the first memory die 524-1, through the data bus 538-1, the link connection 536-1, the pad 531-1, the internal data link 530-2, the pad 531-2, the link connection 536-2, the data bus 538-2, and to the memory array of the second memory die 524-2 via the DBUSA<15:0>556-2. The dotted line 567 indicates the path of data from the serializer or deserializer of the first memory die 524-1, through the data bus 538-1, and to the memory array of the first memory die 524-1 via the DBUSA<15:0>556-1.

As part of the write operation, signals indicative of the data to be written to the first memory die 524-1 can be received from the DQ 550 and the external data link 528-1 to the serializer and/or deserializer of the first memory die 524-1 followed by signals indicative of data to be written to the second memory die 524-2. The signals intended for the first memory die 524-1 can be written thereto via the data buses 538-1 and 556-1 of the first memory die 524-1. The signals intended for the second memory die 524-2 can be passed thereto via the data bus 538-1, link connection 536-1, internal data link 530-2, link connection 536-2, and data buses 538-2, 556-2. Although not specifically illustrated, in some embodiments signals indicative of data intended for the second memory die 524-2 can be received from the DQ 550 prior to signals indicative of data intended for the first memory die 524-1. In such embodiments, the signals indicative of data for the second memory die 524-2 can be passed thereto while the signals indicative of data for the first memory die 524-1 are being received.

Figure 6:
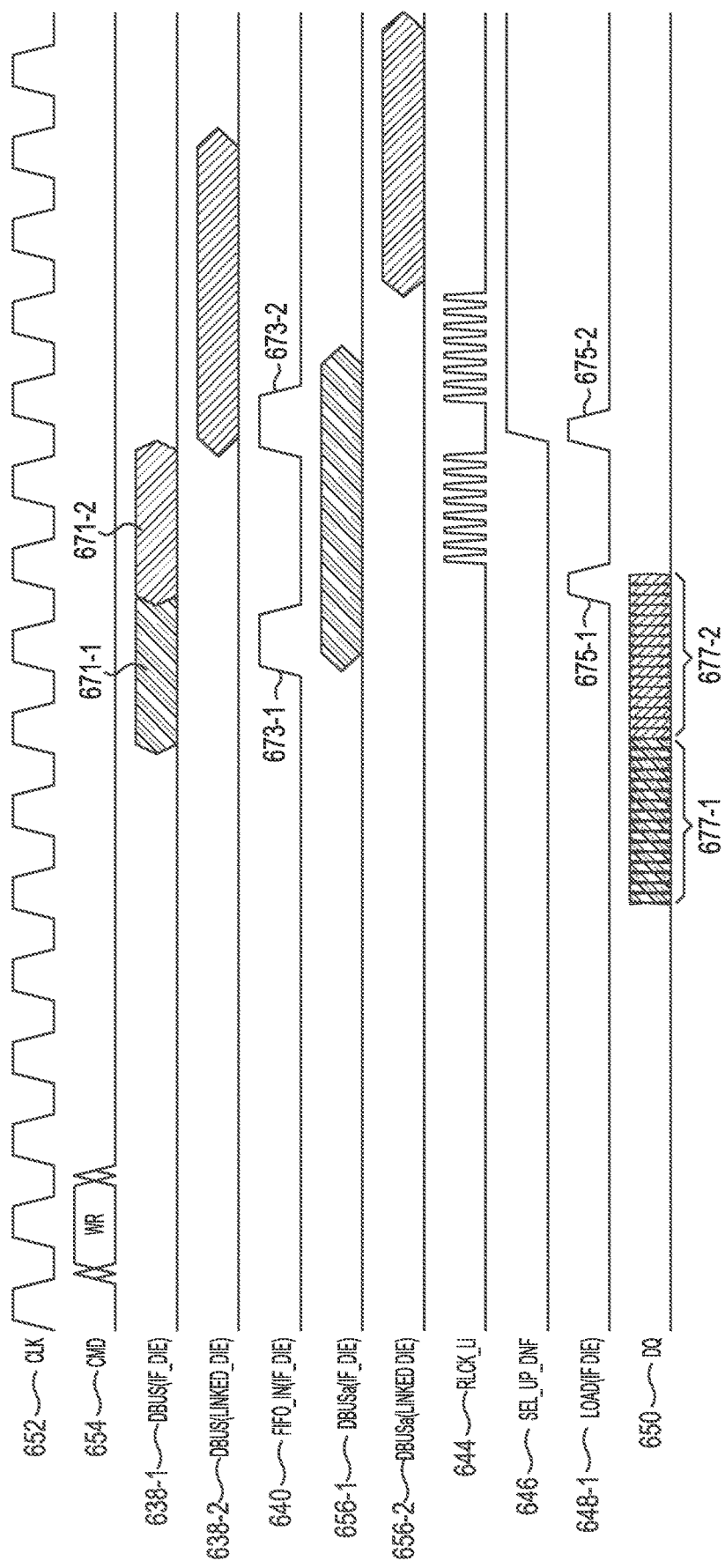
FIG. 6 is a timing diagram for a write operation in accordance with a number of embodiments of the present disclosure.

FIG. 6 is a timing diagram for a write operation in accordance with a number of embodiments of the present disclosure. The timing diagram corresponds to the read operation illustrated with respect to the diagram of the link architecture between memory dice illustrated in FIG. 5. In FIG. 6, the clock signal 652 represents a system clock such as a CA clock. A write command can be issued as indicated by "WR" in the command signal 654. The read clock 644 can operate at a greater frequency than the CA clock as indicated in the read clock signal RLCK_LI 644. The read clock 644 may also be referred to as a write clock and/or a read/write clock.

The DQ line 650 illustrates signals indicative of data being received from the DQ 550 via the external data link 528-1 as illustrated in FIG. 5. The DQ line 650 illustrates first signals 677-1 indicative of data intended for the first memory die and second signals 657-2 indicative of data intended for the second memory die.

The signals indicative of data intended for the first memory die begin to transfer on the data bus ("DBUS") of the first die as indicated by the first eye 671-1 on the DBUS(IF_DIE) 638-1. The signals indicative of data intended for the second memory die follow on the data bus of the first die as indicated by the second eye 671-2 on the DBUS(IF_DIE) 638-1.

The signal FIFO_IN(IF_DIE) 640 is applied to the serializer FIFO of the first memory die. The beginning of the first trigger 673-1 on the FIFO_IN signal 640 corresponds to a opening of the eye on the DBUSa(IF_DIE) 656-1, which represents signals indicative of data for the first memory die being present in the data bus 556-1 illustrated in FIG. 5 (prior to being written to memory, as indicated by a portion of the dotted line 567). The end of the first trigger 673-1 on the FIFO_IN signal 640 corresponds to the data on the DBUS(IF_DIE) 638-1 changing from data intended for the first memory die to data intended for the second memory die.

The end of the first trigger 673-1 on the signal FIFO_IN 640 also corresponds to the start of the first trigger 675-1 on the signal LOAD(IF_DIE) 648-1. The signal LOAD(IF_DIE) 648-1 corresponds to the signal LOAD 548-1 associated with the link connection 336-1 of the first memory die 524-1 in FIG. 5. The end of the first trigger 675-1 on the signal LOAD(IF_DIE) 648-1 corresponds to the start of the first burst on the read clock 644. The load signal 648-1 on the first memory die can go high when both the link flag signal and the RDWTF signal match, as described above.

The start of the second trigger 673-2 on the signal FIFO_IN 640 corresponds to the opening of the eye on the DBUS(LINKED_DIE) 638-2, which represents signals indicative of data for the second memory die being present in the data bus 538-2 illustrated in FIG. 5. The start of the second trigger 673-2 on the signal FIFO_IN 640 also corresponds to the closing of the second eye 671-2 on the DBUS(IF_DIE) 638-1, indicating that all of the data has been passed through the data bus 538-1 of the first memory die 524-1 illustrated in FIG. 5. The start of the second trigger 673-2 on the signal FIFO_IN 640 also corresponds to the end of the first burst on the read clock 644.

The end of the first burst on the read clock 644 corresponds to the signal SEL_UP_DNF 646 going high, which also corresponds to the second trigger 675-2 on the signal LOAD(IF_DIE) 648-1. With respect to FIG. 5, the signal SEL_UP_DNF 546 is applied to a multiplexor in the first memory die 524-1 to control multiplexing of different bursts. The end of the second trigger 675-2 on the signal LOAD(IF_DIE) 648-1 corresponds to the start of the second burst on the read clock 644. The end of the second burst on the read clock 644 corresponds to the opening of the eye on the DBUSa(LINKED DIE) 656-2, which represents signals indicative of data for the second memory die being present in the data bus 556-2 illustrated in FIG. 5 (prior to being written to memory, as indicated by a portion of the dotted line 565).

Figure 7:
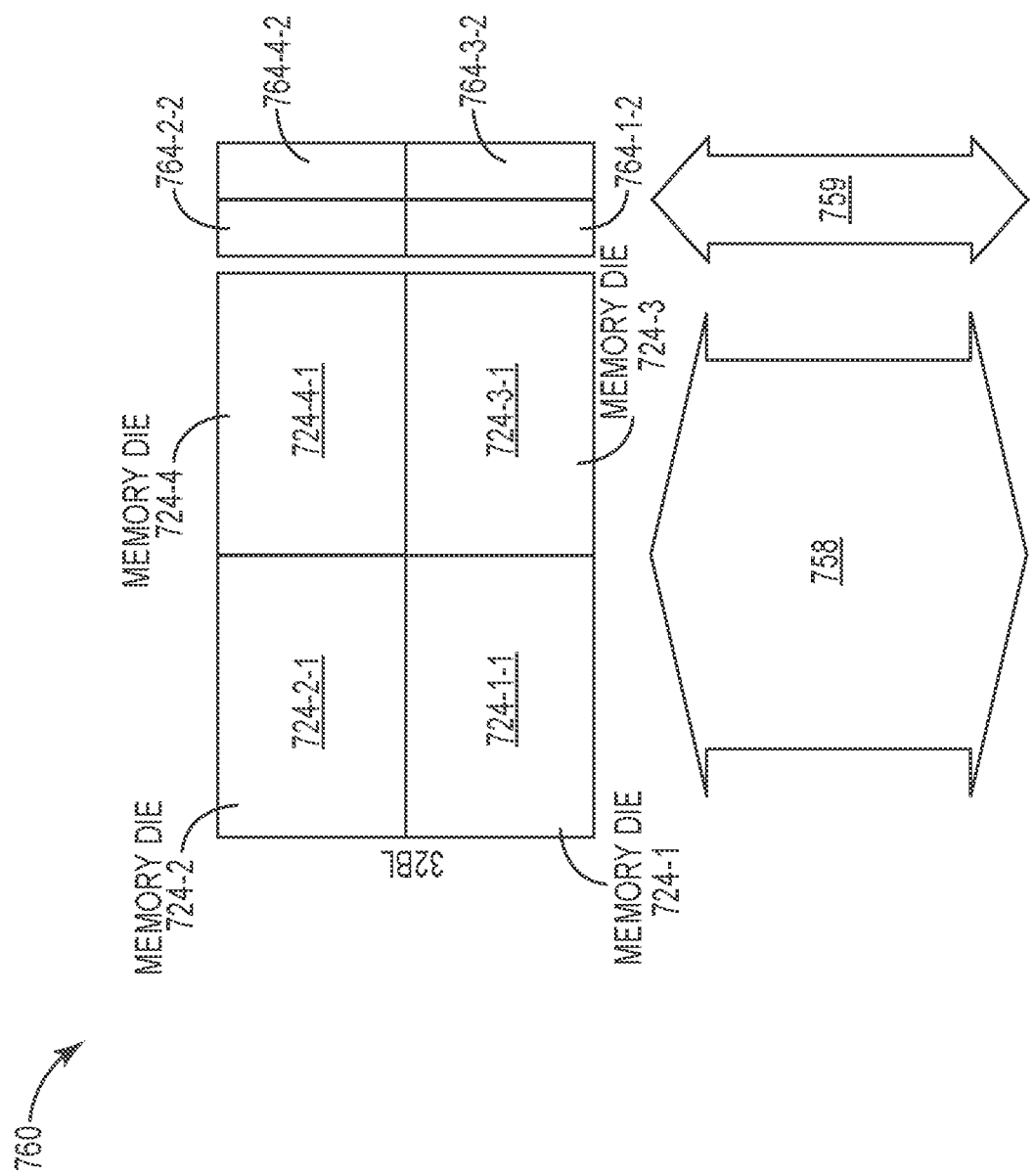
FIG. 7 is a block diagram of a stack of memory dice in accordance with a number of embodiments of the present disclosure.

FIG. 7 is a block diagram of a stack 760 of memory dice in accordance with a number of embodiments of the present disclosure. The stack 760 can include four memory dice 724-1, 724-2, 724-3, and 724-4 (individually or collectively referred to as memory die/dice 724) that are formed on the same substrate (e.g., the substrate 232 illustrated in FIG. 2), although embodiments are not limited to a particular quantity of memory dice the stack can include. The memory dice 724-1 and 724-3 can be primary memory dice that are coupled to the substrate via respective external data links (e.g., the external data links 228-1 and 228-2 illustrated in FIG. 2) and the memory dice 724-2 and 724-4 can be secondary memory dice that are respectively coupled to the primary memory dice 724-1 and 724-3 via respective internal data links (e.g., the internal data links 230-1, . . . , 230-4 illustrated in FIG. 2). As described herein, data stored in the secondary memory dice 724-2 and 724-4 can be transferred out of the stack 760 via the respective primary memory dice 724-1 and 724-3.

As described herein, a memory unit can refer to a set of primary and secondary memory dice that are coupled to one another via an internal data link. For example, the stack 760 can include two memory units, a first memory unit including the primary memory die 724-1 and secondary memory die 724-3 and a second memory unit including the primary memory die 724-2 and secondary memory die 724-4.

A data path 758 can be provided for transferring data to/from respective first portions 724-1-1 and 724-3-1 of the memory dice 724 and a data path 759 can be provided for transferring data to/from respective second portions 724-1-2 and 724-3-2 of the memory dice. The data path 758 can include DQ pins the data path 759 can include one or more DMI pins, or vice versa. For example, the data path 758 can include 16 DQ pins (e.g., 8 DQ pins for each primary memory die 724-1, 724-3) and data path 759 can include 2 DMI pins (e.g., one (1) DMI pin for each primary memory die 724-1, 724-3), which can cause 16-bit data transfer at a time via the data path 758 and 2-bit data transfer at a time via the data path 759.

A memory transfer block can be made up of data transferred from/to the memory dice 724 including, for example, the first portions 724-1-1 and 724-3-1 of) two primary memory dice 724-1 and 724-3 and the first portions 724-2-1 and 724-4-1 of) two secondary memory dice 724-2 and 724-4 (e.g., via the respective primary memory dice 724-1 and 724-3). As used herein, a memory transfer block refers to a unit of data that are transferred to memory dice (e.g., the memory dice 724) or the host (e.g., the host 104 illustrated in FIG. 1) together.

In one example, a respective first portion 724-1-1, 724-2-1, 724-3-1, 724-4-1 of each memory die 724 can be configured for 128 bits of host data, which can be transferred via a respective external data link having 8 DQs and over 16-bit burst length (e.g., 16 beats). For example, during a first 16-bit burst length, 128-bit data stored in each primary dice 724-1, 724-3 can be transferred via respective 8 DQs over 16 beats (e.g., 8 bits per beat), causing 128 bits to be transferred from each primary die 724-1, 724-3 over 16 beats. Subsequently, data stored in each of the secondary dice 724-2, 724-4 (and that have been prefetched to the respective primary memory dice 724-1, 724-3 during the first 16-bit burst length) can be transferred via the respective 8 DQs over subsequent 16 beats (e.g., 8 bits per beat), causing 128 bits to be transferred from each secondary die 724-1, 724-3 over the subsequent 16 beats. Accordingly, in this example, 256 bits are transferred from a respective set of primary and secondary memory dice (e.g., a set of primary and secondary memory dice 724-1 and 724-2 or 724-3 and 724-4) via each external data link having 8 DQs over 32 beats.

In one example, a respective second portion 724-1-2, 724-2-2, 724-3-2, 724-4-2 of each memory die 724 can be configured for auxiliary data, which can be transferred via one or more DMI pins of the respective external data link. The auxiliary data can include error detection information, error correction information, and/or metadata associated with performance of the memory operation. For example, a respective second portion of each memory die 724 can include the error correction information having 9 bits, the metadata having 1 bit, and the error detection information having 4 bits such that each memory die 724 can be configured for total 14 bits of auxiliary data. As described herein, the error detection information can be CRC data. The error correction information can be parity for correcting bit error(s) within the same memory die. For example, the parity data can correct a single-bit error on the respective memory die 724. The parity data can further indicate (e.g., detect) two-bit errors without correcting two-bit errors. The error detection information (e.g., CRC) can further indicate that particular bit errors were not correctable/detectable using the parity.

Figure 8:
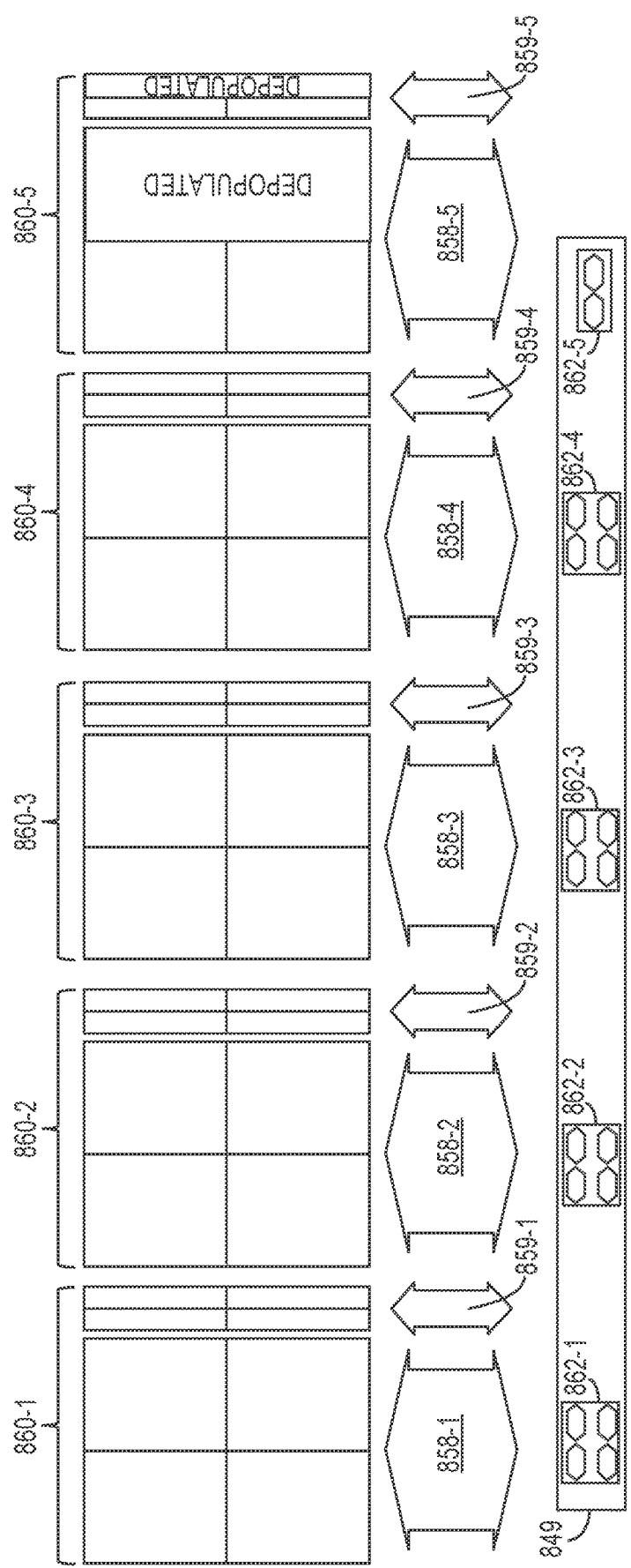
FIG. 8 is a block diagram of stacks of memory dice for a chip kill operation in accordance with a number of embodiments of the present disclosure.

FIG. 8 is a block diagram of stacks of memory dice 860 for a chip kill operation in accordance with a number of embodiments of the present disclosure. Each stack 860-1, 860-2, 860-3, 860-4, 860-5 (individually or collectively referred to as a stack/stacks of memory dice 860) can be analogous to the stack of memory dice 760 illustrated in FIG. 7. Although 5 stacks of memory dice 860 are illustrated in FIG. 8, embodiments are not limited to a particular quantity of stacks of memory dice that can be configured for a chip kill operation.

Stacks of memory dice being configured for a chip kill operation generally refers to scenarios in which data are transferred from the stacks that are error-corrected together with a chip kill operation using the same parity (e.g., chip kill parity, such as LPCK parity). For example, data transferred from respective primary memory dice of the stacks 860 during the same beat (of a first portion of the burst, such as during a first beat of the first 16 BLs) of the burst and data transferred from respective secondary memory dice of the stacks 860 during the same beat (of a second portion of the burst, such as during a first beat of the subsequent 16 BLs) of the burst can form a single codeword on which a chip kill operation can be performed. In general, a "codeword" comprises a smallest collection of data that is individually protected by ECC. Typically, a codeword may the smallest read unit allowed by a memory die, although embodiments are not so limited.

Multiple codewords can be formed based on data from the stacks of memory dice 860. Each codeword of a first set of codewords can be made up of a multi-bit symbol (e.g., 8-bit symbol) received from the respective first portion (e.g., the first portion 724-1-1, 724-2-1, 724-3-1, 724-4-1 illustrated in FIG. 7) of each memory die of the stacks 860 via a data path 858-1, 858-2, 858-3, 858-4, 858-5. A multibit symbol can be a non-binary symbol. For example, non-binary symbol(s) having N bits can be one of $2^N$ elements of a finite Galois field. As used herein, a multibit symbol and a non-binary symbol are used interchangeably here and can have the same meaning, as appropriate to the context.

Each codeword of a second (e.g., subsequent) set of codewords can be made up of a multi-bit symbol (e.g., 9-bit symbol or 5-bit symbol) received from the respective second portion (e.g., the second portions 724-1-2, 724-2-2, 724-3-2, and 724-4-2) of each memory die of the stacks 860 via a data path 859-1, 859-2, 859-3, 859-4, 859-5. In an example where a respective second portion of each memory die 724 illustrated in FIG. 7, herein includes 9 bits of error correction information, 1 bit of metadata, and 4 bits of error detection information (total 14 bits for each memory die of the stacks 860), a first codeword of the second set can include an 9-bit symbol of each memory die of the stacks 860 and a second (last) codeword of the second set can include a 5-bit symbol (comprising 5 bits of the respective error detection information and metadata).

An example codeword 849 illustrated in FIG. 8 can include symbols (e.g., data and parity symbols) transferred from the stacks 860 over one or more beats. For example, the symbols of the codeword 849 that are transferred from first portions (e.g., the first portions 724-1-1, 724-2-1, 724-3-1, and 724-4-1 illustrated in FIG. 7) of memory dice of the stacks 860 can be transferred over a respective single beat of the burst, while the symbols of the codeword 849 that are transferred from second portions (e.g., the second portions 724-1-1, 724-2-1, 724-3-1, and 724-4-1 illustrated in FIG. 7) of memory dice of the stacks 860 can be transferred over multiple beats of the burst.

As illustrated in FIG. 8, the codeword 849 includes 18 symbols including a first set of symbols 862-1 from the stack of memory dice 860-1 (two data symbols from the respective primary memory dice of the stack 860-1 and two data symbols from the respective secondary memory dice of the stack 860-1), a second set of symbols 862-2 from the stack of memory dice 860-2 (two data symbols from the respective primary memory dice of the stack 860-2 and two data symbols from the respective secondary memory dice of the stack 860-2), a third set of symbols 862-3 from the stack of memory dice 860-3 (two data symbols from the respective primary memory dice of the stack 860-3 and two data symbols from the respective secondary memory dice of the stack 860-3), a fourth set of symbols 862-4 from the stack of memory dice 860-4 (two data symbols from the respective primary memory dice of the stack 860-4 and two data symbols from the respective secondary memory dice of the stack 860-4), and a fifth set of symbols 862-5 from the stack of memory dice 860-5 (one parity symbol from the primary memory die of the stack 860-5 and one parity symbol from the secondary memory die of the stack 860-5).

At least one stack of the stacks 860 can be configured for parity data, such as LPCK parity, which can be used for a chip kill operation. For example, the stack 860-5 can be configured for the LPCK parity data. As illustrated in FIG. 8, a single set of primary and secondary memory dice of the stack 860-5 is depopulated such that just a single set of primary and secondary memory dice of the stack 860-5 is configured for parity data. Accordingly, in this example, an overhead is 12.5% (2 parity symbols/16 data symbols of the codeword 849).

Continuing with this example, host data (e.g., data symbols) transferred from the stacks of memory dice 860-1, 860-2, 860-3, and 860-4 and LPCK parity data (e.g., parity symbols) transferred from the stack of memory dice 860-5 can form a codeword, and a chip kill operation can be performed, if needed, on the codeword using the parity data. The chip kill operation performed on the codeword can restore the codeword despite a failure of a particular quantity of memory dice (e.g., symbols). For example, in the embodiment illustrated in FIG. 8, the chip kill operation performed on the codeword with 2 parity symbols with 16 data symbols can correct up to one symbol error and detect up to two symbol errors.

Each codeword can be made up of a number of symbols that are respectively transferred from memory dice of the stacks 860. For example, in the embodiment illustrated in FIG. 8, the codeword can include 16 data symbols that are respectively from 4 dice of each stack 860-1, ..., and 860-4 (e.g., 16 data symbols from the stacks 860-1, ..., 860-4) and 2 parity symbols respectively from 2 dice of the stack 860-5 (e.g., two symbols from the stack 860-5). An LPCK operation performed on the codeword having two parity symbols out of 18 total symbols can correct up to one symbol error. In the embodiment illustrated in FIG. 8, the memory transfer block having the codewords can include 256 bytes (64 bytes from each stack 860) of data symbols and 32 bytes (32 bytes from the stack 860-5) of parity symbols.

A number of channels (e.g., the channels 118 illustrated in FIG. 1) coupled to one or more stacks of memory dice 860 that are configured for a codeword (e.g., including data and parity symbols that are striped together) can be referred to as an LPCK channel. As used herein, the data symbols that share the same parity symbols can be referred to as being striped together (along with the parity symbols).

The computing system (e.g., the computing system 100 illustrated in FIG. 1) can include multiple LPCK channels. For example, the memory devices (e.g., the memory devices 116 illustrated in FIG. 1) can be configured for three separate LPCK channels each LPCK channel including 4 stacks of memory dice configured for host data and at least a portion of the stack of memory dice configured for LPCK parity data, such as those stacks 860. Accordingly, in an example where a respective external data link of each stack 860 includes 8 DQs, each LPCK channel can transfer 72 bits (8 bits*9 memory dice) per beat of the burst.

Figure 9:
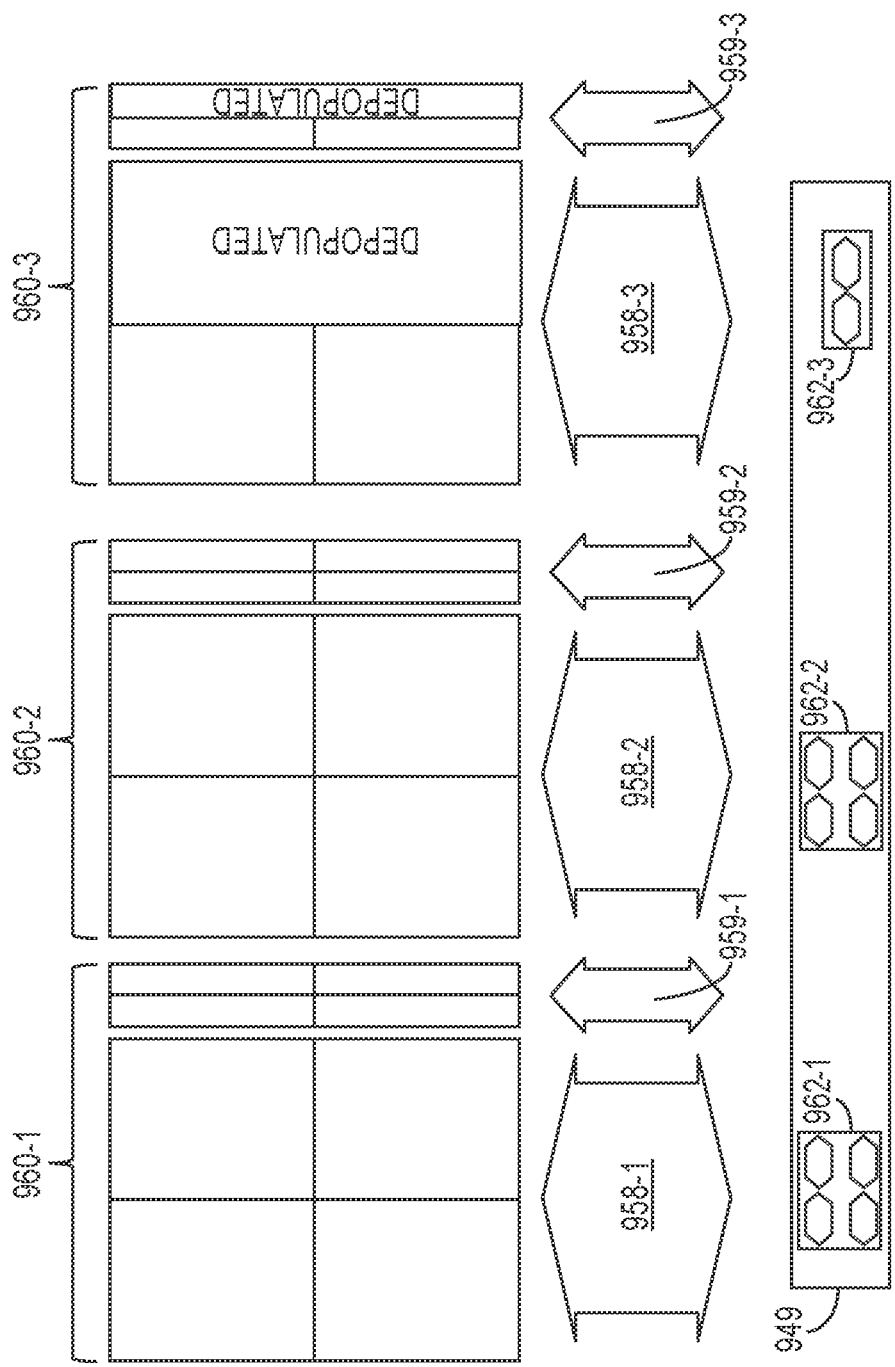
FIG. 9 is another block diagram of stacks of memory dice for a chip kill operation in accordance with a number of embodiments of the present disclosure.

FIG. 9 is another block diagram of stacks of memory dice 960 for a chip kill operation in accordance with a number of embodiments of the present disclosure. Each stack 960-1, 960-2, 960-3 (individually or collectively referred to as a stack/stacks of memory dice 960) can be analogous to a stack of memory dice illustrated in FIG. 7 and/or stacks of memory dice 860 illustrated in FIG. 8.

The stacks of memory dice 960 can be configured for a chip kill operation in the similar manner as that of the stacks of memory dice 860 illustrated in FIG. 8. Unlike the embodiment illustrated in FIG. 8, the embodiment illustrated in FIG. 9 includes 3 stacks, in which 2 stacks of memory dice 960-1 and 960-2 are configured for host data and 1 stack of memory dice 960-3 is configured for parity data, such as LPCK parity data. Similar to the embodiment illustrated in FIG. 8 and as illustrated in FIG. 9, a single set of primary and secondary memory dice of the stack 960-3 is depopulated such that just a single set of primary and secondary memory dice of the stack 960-3 is configured for parity data.

As illustrated in FIG. 9, the codeword 949 includes 10 symbols including a first set of symbols 962-1 from the stack of memory dice 960-1 (two data symbols from the respective primary memory dice of the stack 960-1 and two data symbols from the respective secondary memory dice of the stack 960-1), a second set of symbols 962-2 from the stack of memory dice 960-2 (two data symbols from the respective primary memory dice of the stack 960-2 and two data symbols from the respective secondary memory dice of the stack 960-2), and a third set of symbols 962-3 from the stack of memory dice 960-3 (one parity symbol from the primary memory die of the stack 960-3 and one parity symbol from the secondary memory die of the stack 960-3). An LPCK operation performed on the codeword having two parity symbols out of 18 total symbols can correct up to one symbol error. Accordingly, in this example, an overhead (2 parity symbols/8 data symbols) is 25%. Further, a memory transfer block of the embodiment illustrated in FIG. 9 can include 128 bytes (64 bytes from each stack 960) of data symbols and 32 bytes (32 bytes from the stack 960-3) of parity symbols.

The stacks of memory dice 960 can be a single LPCK channel. In one example, the memory devices (e.g., the memory devices 116 illustrated in FIG. 1) can be configured for five separate LPCK channels each LPCK channel including 2 stacks of memory dice configured for host data and at least a portion of the stack of memory dice configured for LPCK parity data, such as those stacks 960. Accordingly, in an example where a respective external data link of each stack 860 includes 8 DQs, each LPCK channel can transfer 40 bits (8 bits*5 memory dice) pert beat of the burst.

Figure 10:
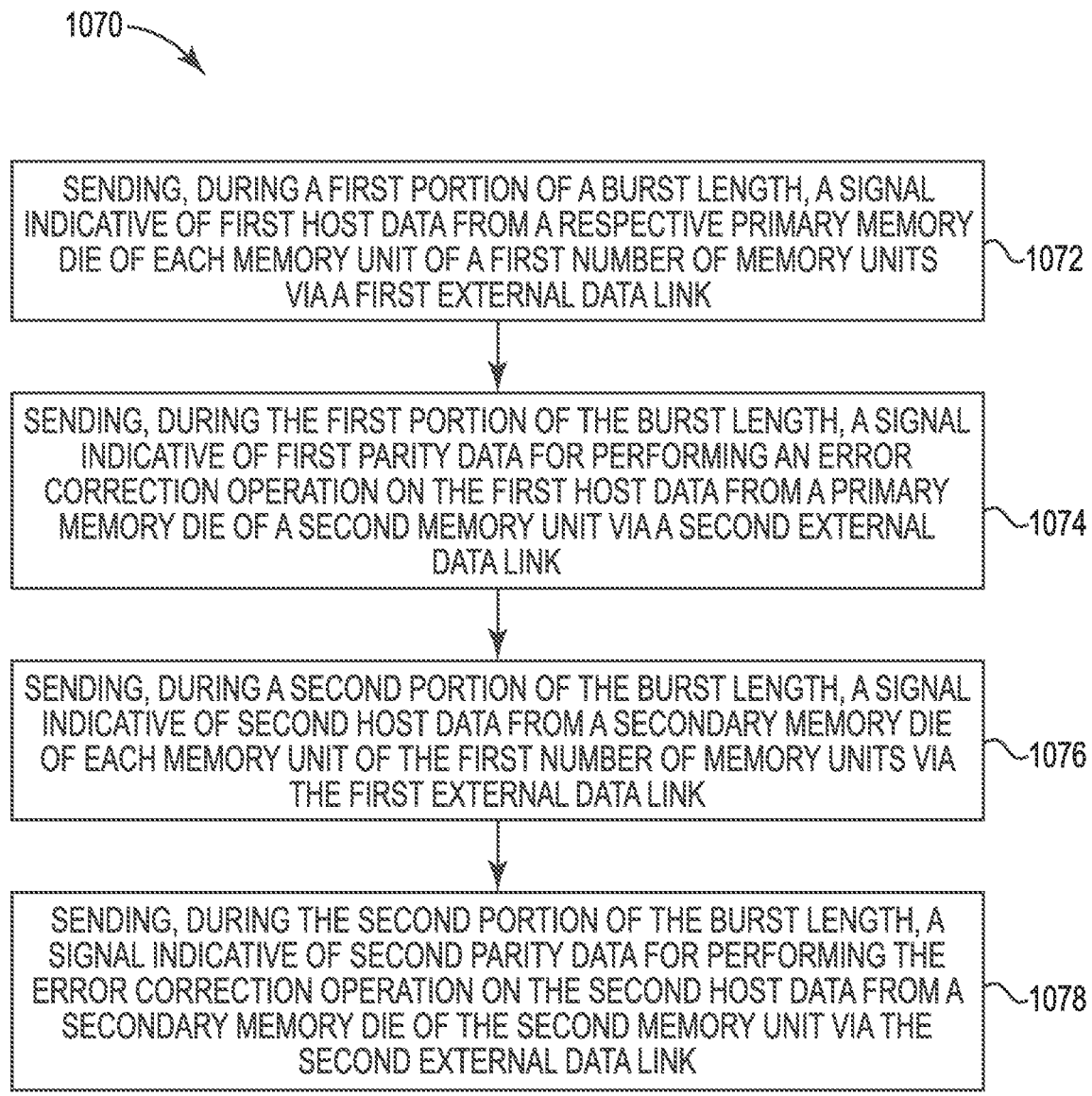
FIG. 10 is a flow diagram of a method for data protection for stacks of memory dice in accordance with a number of embodiments of the present disclosure.

FIG. 10 is a flow diagram of a method 1070 for data protection for stacks of memory dice in accordance with a number of embodiments of the present disclosure. The method 1070 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1070 is performed by the central controller portion 110 illustrated in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 1072, during a first portion of a burst length, a signal indicative of first host data can be sent from a respective primary memory die (e.g., primary memory dice 724-1 and 724-3 illustrated in FIG. 7) of each memory unit of a first number of memory units (e.g., the memory units of the stacks of memory dice 860-1, ..., 860-4 illustrated in FIG. 8 or the memory units of the stacks of memory dice 960-1 and 960-2 illustrated in FIG. 9) via a first external data link (e.g., the external data link 228-1 or 228-2 illustrated in FIG. 2). At 1074, during the first portion of the burst length, a signal indicative of first parity data for performing an error correction operation on the first host data can be sent from a primary memory die (e.g., primary memory dice 724-1 or 724-3 illustrated in FIG. 7) of a second memory unit (e.g., the memory unit of the stack of memory dice 860-5 illustrated in FIG. 8 or the memory unit of the stack of memory dice 960-3 illustrated in FIG. 9) via a second external data link (e.g., the external data link 228-1 or 228-2 illustrated in FIG. 2, the external data link 328-2 illustrated in FIG. 3, or the external data link 528-2 illustrated in FIG. 5).

At 1076, during a second portion of the burst length, a signal indicative of second host data can be sent from a secondary memory die (e.g., secondary memory dice 724-2 and 724-4 illustrated in FIG. 7) of each memory unit of a first number of memory units via the first external data link. At 1078, during the second portion of the burst length, a signal indicative of second parity data for performing the error correction operation on the second host data can be sent from a secondary memory die (e.g., secondary memory dice 724-2 or 724-4 illustrated in FIG. 7) of the second memory unit via the second external data link.

In some embodiments, during the first portion of the burst length, a signal indicative of the second host data can be sent from the secondary memory die of each memory unit of the first number of memory units to the primary memory die of the respective memory unit of the first number of memory units via a first internal data link. Further, a signal indicative of the second parity data can be sent from the secondary memory die of the second memory unit to the primary die of the second memory unit via a second internal data link (e.g., the internal data link 230-2 or 230-4 illustrated in FIG. 2, the internal data link 330-2 illustrated in FIG. 3, or the internal data link 530-2 illustrated in FIG. 5).

In some embodiments, during the first portion of the burst length, a signal indicative of auxiliary data corresponding to the first host data can be sent from the respective primary memory die of each memory unit of the first number of memory units via a data mask inversion (DMI) pin (e.g., the DMI pin of the data path 759, 859, or 959 illustrated in FIG. 7, FIG. 8, and FIG. 9, respectively) of the first external data link. Further, during the first portion of the burst length, a signal indicative of auxiliary data corresponding to the first parity data can be sent from the primary memory die of the second memory unit via a DMI pin (e.g., the DMI pin of the data path 759, 859, or 959 illustrated in FIG. 7, FIG. 8, and FIG. 9, respectively) of the second external data link. In some embodiments, during the second portion of the burst length, a signal indicative of auxiliary data corresponding to the second host data can be sent from the respective secondary memory die of each memory unit of the first number of memory units via the DMI pin of the first external data link. Further, a signal indicative of auxiliary data corresponding to the second parity data can be sent from the secondary memory die of the second memory unit via the DMI pin of the second external data link.

Figure 11:
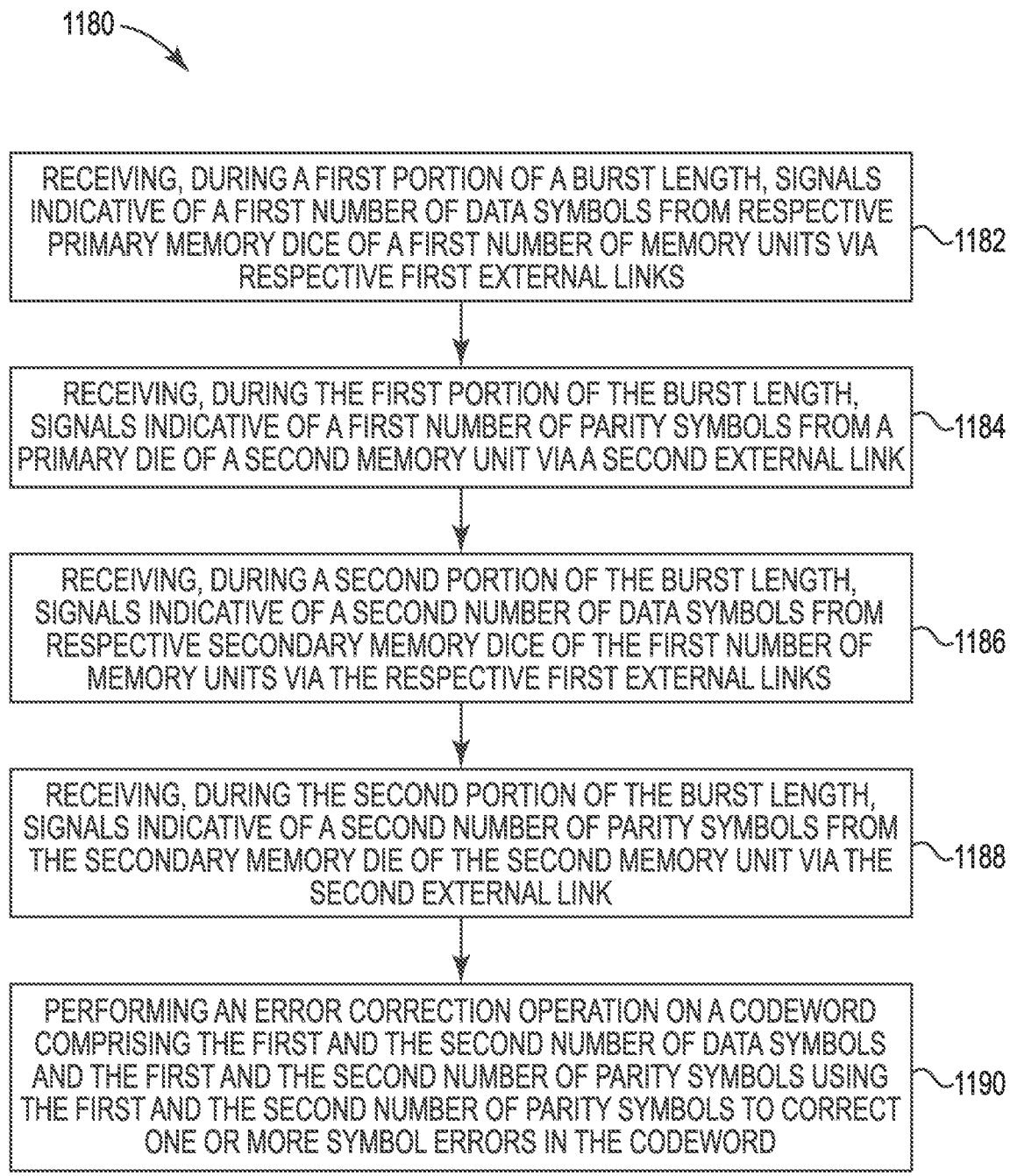
FIG. 11 is a flow diagram of another method for data protection for stacks of memory dice in accordance with a number of embodiments of the present disclosure.

FIG. 11 is a flow diagram of another method 1180 for data protection for stacks of memory dice in accordance with a number of embodiments of the present disclosure. The method 1180 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1180 is performed by the central controller portion 110 illustrated in FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 1182, during a first portion of a burst length, signals indicative of a first number of data symbols (e.g., the data symbols 862-1, . . . , 862-4 illustrated in FIG. 8 or the data symbols 962-1 and 962-2 illustrated in FIG. 9) can be received from respective primary memory dice (e.g., primary memory dice 724-1 and 724-3 illustrated in FIG. 7) of a first number of memory units (e.g., the memory units of the stacks of memory dice 860-1, . . . , 860-4 illustrated in FIG. 8 or the memory units of the stacks of memory dice 960-1 and 960-2 illustrated in FIG. 9) via respective first external links (e.g., the external data link 228-1, 228-2, 328-2, and 528-2 illustrated in FIG. 2, FIG. 3, and FIG. 5, respectively). At 1184, during the first portion of the burst length, signals indicative of a first number of parity symbols (e.g., the parity symbol 862-5 illustrated in FIG. 8 or the parity symbol 962-3 illustrated in FIG. 9) can be received from a primary die (e.g., primary memory dice 724-1 or 724-3 illustrated in FIG. 7) of a second memory unit (e.g., the memory unit of the stack of memory dice 860-5 illustrated in FIG. 8 or the memory unit of the stack of memory dice 960-3 illustrated in FIG. 9) via a second external link (e.g., the external data link 228-1 or 228-2 illustrated in FIG. 2, the external data link 328-2 illustrated in FIG. 3, or the external data link 528-2 illustrated in FIG. 5).

At 1186, during a second portion of the burst length, signals indicative of a second number of data symbols (e.g., the data symbols 862-1, . . . , 862-4 illustrated in FIG. 8 or the data symbols 962-1 and 962-2 illustrated in FIG. 9) can be received from respective secondary memory dice (e.g., secondary memory dice 724-2 and 724-4 illustrated in FIG. 7) of the first number of memory units via the respective first external links. At 1088, during the second portion of the burst length, signals indicative of a second number of parity symbols (e.g., the parity symbol 862-5 illustrated in FIG. 8 or the parity symbol 962-3 illustrated in FIG. 9) can be received from the secondary memory die (e.g., secondary memory dice 724-2 or 724-4 illustrated in FIG. 7) of the second memory unit via the second external link. At 1190, an error correction operation can be performed on a codeword (e.g., the codeword 849 or 949 illustrated in FIG. 8 and FIG. 9, respectively) comprising the first and the second number of data symbols and the first and the second number of parity symbols using the first and the second number of parity symbols to correct one or more symbol errors in the codeword.

In some embodiments, during the first portion of the burst length, signals indicative of error correction information and error detection information corresponding to the first number of data symbols can be received from the respective primary memory dice of the first number of memory units via the respective first external links. Further, during the second portion of the burst length, signals indicative of error correction information and error detection information corresponding to the second number of data symbols can be from the respective secondary memory dice of the first number of memory units via the respective first external links. Further, one or more bit errors on the respective data symbol of the first and the second number of data symbols can be corrected on the first and the second number of data symbols using the error correction information respectively received during the first portion and the second portion of the burst length.

In some embodiments, subsequent to correcting the one or more bit errors, an error detection operation can be performed on the first and the second number of data symbols using the error detection information respectively received during the first portion and the second portion of the burst length. In some embodiments, the error correction operation can be performed responsive to the error detection operation performed on the first and the second number of data symbols indicating one or more errors uncorrectable using the error correction information.

In some embodiments, the respective signals indicative of the first number of data symbols, the second number of data symbols, the first parity symbols, or the second parity symbols can be received over multiple beats of the burst length. In some embodiments, the respective signals indicative of the first number of data symbols, the second number of data symbols, the first parity symbols, or the second parity symbols can be received over a respective single beat of the burst length.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first number of memory units configured for host data, each memory unit of the first number of memory units further comprising:
     a primary memory die configured for a respective first portion of the host data and coupled to a respective first substrate via a respective first external data link; and
     a secondary memory die configured for a respective second portion of the host data and coupled to the primary memory die via a respective first internal data link; and
   a second memory unit configured for parity data to perform an error correction operation on the host data, the second memory unit further comprising:
     a primary memory die configured for a respective first portion of the parity data and coupled to a respective second substrate via a respective second external data link; and
     a secondary memory die configured for a respective second portion of the parity data and coupled to the primary memory die via a respective second internal data link.

2. The apparatus of claim 1, wherein:
   the secondary memory die of each memory unit of the first number of memory units is not coupled to the respective first substrate; and
   the secondary memory die of the second memory unit is not coupled to the respective second substrate.

3. The apparatus of claim 1, wherein:
   each memory die of the first number of memory units or the second memory unit further comprises auxiliary data corresponding to the host data or the parity data stored in the respective memory die; and
   the auxiliary data comprises error correction information, error detection information, or metadata corresponding to the host data or the parity data stored in the respective memory die, or any combination thereof.

4. The apparatus of claim 3, wherein the error detection information comprises cyclic redundancy check (CRC) data corresponding to the host data or the parity data stored in the respective memory die.

5. The apparatus of claim 3, wherein the error correction information is configured to correct one or more bit errors in the host data or the parity data stored in the respective memory die.

6. The apparatus of claim 1, wherein the respective first or the respective second external data link, or both, comprises a number of data pins and a number of data mask inversion (DMI) pins.

7. The apparatus of claim 6, wherein:
   the number of data pins are configured for exchanging the host data or the parity data; and
   the number of DMI pins are configured for exchanging auxiliary data corresponding to the host data or the parity data.

8. The apparatus of claim 1, wherein:
   the host data corresponds to a number of data symbols; and
   the parity data corresponds to a number of parity symbols;
   wherein the number of parity symbols is configured to correct one or more symbols errors in the number of data symbols.

9. The apparatus of claim 1, wherein the first number of memory units and the second memory unit forms a low-power chip kill (LPCK) channel, and wherein the apparatus further comprises one or more LPCK channels.

10. The apparatus of claim 9, further comprises one or more memory devices each comprising at least two memory units that are formed on the same substrate, and wherein memory dice of at least one of the one or more memory devices are subject to different LPCK channels.

11. The apparatus of claim 1, wherein at least two memory units of the first number of memory units are formed on the same first substrate.

12. A method, comprising:
   during a first portion of a burst length:
     sending a signal indicative of first host data from a respective primary memory die of each memory unit of a first number of memory units via a first external data link; and
     sending a signal indicative of first parity data for performing an error correction operation on the first host data from a primary memory die of a second memory unit via a second external data link; and
   during a second portion of the burst length:
     sending a signal indicative of second host data from a secondary memory die of each memory unit of the first number of memory units via the first external data link; and
     sending a signal indicative of second parity data for performing the error correction operation on the second host data from a secondary memory die of the second memory unit via the second external data link.

13. The method of claim 12, further comprising, during the first portion of the burst length:
   sending a signal indicative of the second host data from the secondary memory die of each memory unit of the first number of memory units to the primary memory die of the respective memory unit of the first number of memory units via a first internal data link; and sending a signal indicative of the second parity data from the secondary memory die of the second memory unit to the primary die of the second memory unit via a second internal data link.

14. The method of claim 12, further comprising:

during the first portion of the burst length:
- sending a signal indicative of auxiliary data corresponding to the first host data from the respective primary memory die of each memory unit of the first number of memory units via a data mask inversion (DMI) pin of the first external data link; and
- sending a signal indicative of auxiliary data corresponding to the first parity data from the primary memory die of the second memory unit via a DMI pin of the second external data link; and during the second portion of the burst length:
- sending a signal indicative of auxiliary data corresponding to the second host data from the respective secondary memory die of each memory unit of the first number of memory units via the DMI pin of the first external data link; and
- sending a signal indicative of auxiliary data corresponding to the second parity data from the secondary memory die of the second memory unit via the DMI pin of the second external data link.

15. A method, comprising:

during a first portion of a burst length:
- receiving signals indicative of a first number of data symbols from respective primary memory dice of a first number of memory units via respective first external links; and
- receiving signals indicative of a first number of parity symbols from a primary die of a second memory unit via a second external link;

during a second portion of the burst length:
- receiving signals indicative of a second number of data symbols from respective secondary memory dice of the first number of memory units via the respective first external links; and
- receiving signals indicative of a second number of parity symbols from the secondary memory die of the second memory unit via the second external link; and performing an error correction operation on a codeword comprising the first and the second number of data symbols and the first and the second number of parity symbols using the first and the second number of parity symbols to correct one or more symbol errors in the codeword.

16. The method of claim 15, further comprising:

during the first portion of the burst length, receiving signals indicative of error correction information and error detection information corresponding to the first number of data symbols from the respective primary memory dice of the first number of memory units via the respective first external links;

during the second portion of the burst length, receiving signals indicative of error correction information and error detection information corresponding to the second number of data symbols from the respective secondary memory dice of the first number of memory units via the respective first external links; and correcting one or more bit errors on the respective data symbol of the first and the second number of data symbols using the error correction information respectively received during the first portion and the second portion of the burst length.

17. The method of claim 16, further comprising performing, subsequent to correcting the one or more bit errors, an error detection operation on the first and the second number of data symbols using the error detection information respectively received during the first portion and the second portion of the burst length.

18. The method of claim 17, further comprising performing the error correction operation responsive to the error detection operation performed on the first and the second number of data symbols indicating one or more errors uncorrectable using the error correction information.

19. The method of claim 15, further comprising receiving the respective signals indicative of the first number of data symbols, the second number of data symbols, the first parity symbols, or the second parity symbols over multiple beats of the burst length.

20. The method of claim 15, further comprising receiving the respective signals indicative of the first number of data symbols, the second number of data symbols, the first parity symbols, or the second parity symbols over a respective single beat of the burst length.

* * * * *